United States Patent [19]
Bruekers et al.

[11] Patent Number: 5,784,414
[45] Date of Patent: Jul. 21, 1998

[54] RECEIVER WITH QUADRATURE DECIMATION STAGE, METHOD OF PROCESSING DIGITAL SIGNALS

[75] Inventors: Alphons A. M. L. Bruekers; Gerardus C. M. Gielis, both of Eindhoven, Netherlands

[73] Assignee: U.S. Philips Corporation, New York, N.Y.

[21] Appl. No.: 523,704

[22] Filed: Sep. 5, 1995

[30] Foreign Application Priority Data

Sep. 2, 1994 [EP] European Pat. Off. ............. 94202518

[51] Int. Cl.$^6$ ...................................... H04L 27/14
[52] U.S. Cl. ..................... 375/324; 375/346; 375/350
[58] Field of Search ........................... 375/346, 322, 375/349, 324, 350, 328; 364/724.01, 724.1

[56] References Cited

U.S. PATENT DOCUMENTS

| | | | |
|---|---|---|---|
| 5,214,678 | 5/1993 | Rault et al. | 375/240 |
| 5,272,534 | 12/1993 | Vromans et al. | 348/731 |
| 5,572,249 | 11/1996 | Ghosh | 375/346 |

FOREIGN PATENT DOCUMENTS 0486095  5/1992  European Pat. Off. ......... H03D 3/00

OTHER PUBLICATIONS

Crochiere et al., *Multirate Digital Signal Processing*, p. 79.

*Primary Examiner*—Don N. Vo
*Attorney, Agent, or Firm*—Steven R. Biren

[57] ABSTRACT

In a the receiver, a reception signal is digitized (5) with a relatively high sampling frequency. Analog filters (2, 4) prevent aliasing. The digitized reception signal is applied via a splitter (100) to a quadrature digital signal processor (9, 10, 11, 12). In this processor, a desired carrier is selected and demodulated. The splitter (100) transforms the digitized reception signal in accordance with a first and a second transform function ($H_1$, $H_2$) to obtain in-phase and quadrature components ($xi$, $yi$), respectively. The sampling frequency is reduced (130, 140) in the splitter. A specific relation between the phase and magnitude of the transform functions ($H_1$, $H_2$) prevents aliasing. Such a relation can be achieved with relatively simple digital filters (110, 120).

10 Claims, 16 Drawing Sheets

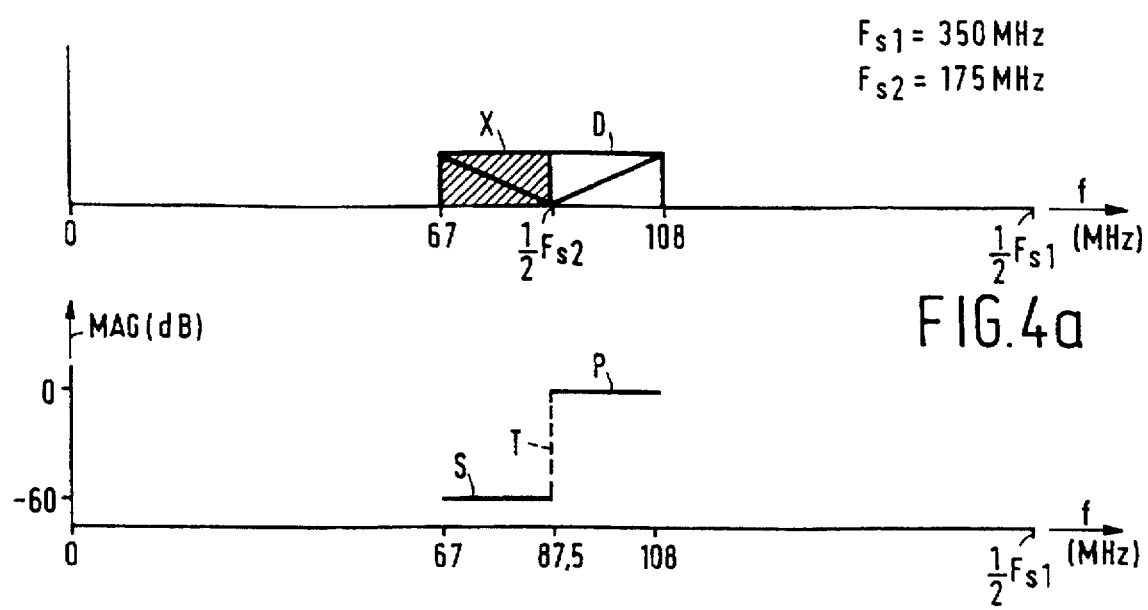

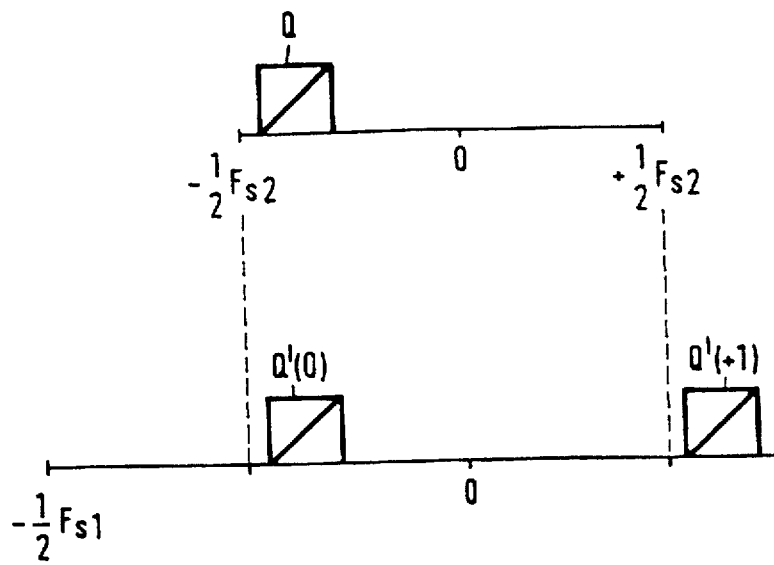
FIG.9a
FIG.9b
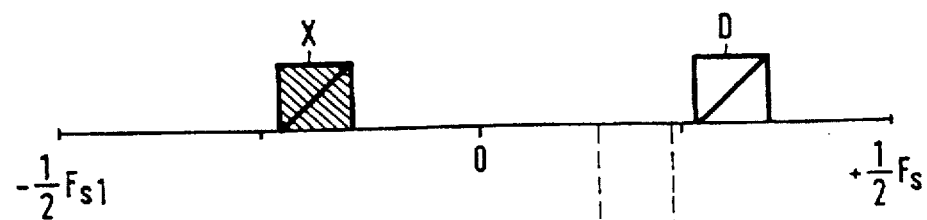
FIG.9c
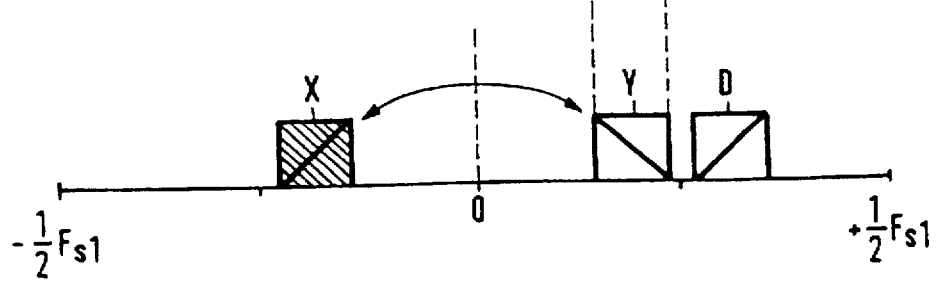
FIG.9d
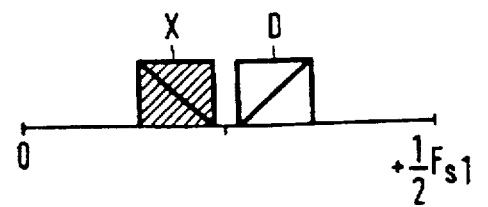
FIG.9e

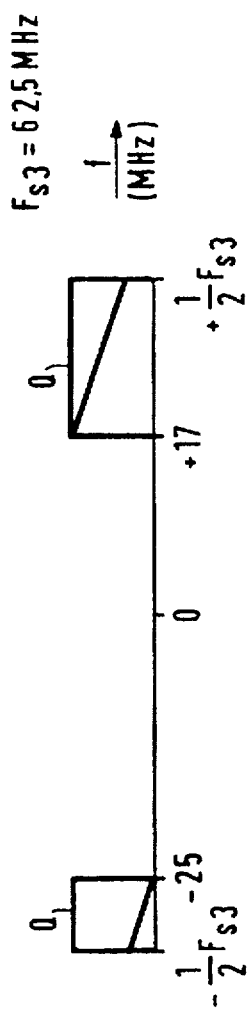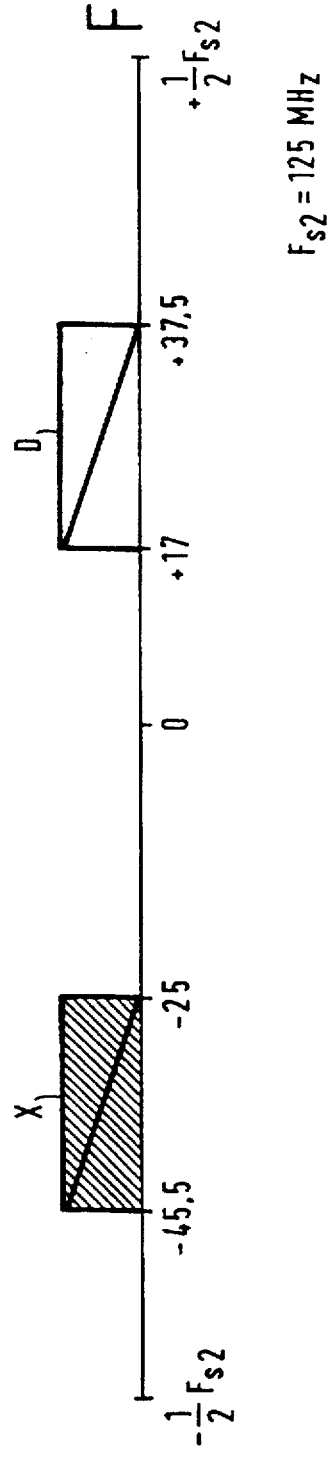

RECEIVER WITH QUADRATURE DECIMATION STAGE, METHOD OF PROCESSING DIGITAL SIGNALS

BACKGROUND OF THE INVENTION

The invention relates to a receiver as defined in the pre-characterizing part of claim 1. The invention also relates to a digital signal processing arrangement, a quadrature decimation stage and a method of processing digital signals.

A receiver as defined in the pre-characterizing part of claim 1 is known from EP-A-0.486.095. It is particularly suitable for receiving RF-carrier-modulated information which may be, for example, radio and TV broadcast programs.

In the known receiver, shown in FIG. 1, a reception signal first passes an analog RF input section comprising filters 2 and 4 and amplifier 3, and is subsequently digitized by A/D converter 5. Splitter 6 transforms the digitized reception signal in accordance with a first transform function (D) and a second transform function (HT), respectively. Accordingly, a first split signal (xi) and a second split signal (yi) are obtained which are supplied to a digital quadrature processor 200. In this processor, a desired carrier is selected and subsequently demodulated.

In the known receiver, the digital quadrature processor 200 comprises a first coordinate rotation digital computer (Cordic) 9, filters 10 and 11 and a second Cordic 12. The first Cordic 9 operates as a digital quadrature mixer-oscillator stage which effectuates a frequency conversion. The first Cordic 9 can be tuned in such a way that the desired carrier is frequency-converted into the passband of filters 10 and 11. Filters 10 and 11 provide the desired channel selectivity. They suppress interfering signals that are frequency-adjacent to the desired carrier. The filtered and frequency-converted desired carrier is supplied to the second Cordic 12 for demodulation. The second Cordic 12 operates as a cartesian-to-polar converter which can both amplitude and phase-demodulate the desired carrier.

In the known receiver, the splitter 6 and the first Cordic 9 have to operate at a clock frequency which is at least the sampling frequency of the A/D converter 5. In EP-A-0.486, 095 an example of an FM broadcast receiver is discussed in which the sampling frequency of the A/D converter is 350 MHz. In such a receiver, the first Cordic 9 will typically be in the form of an integrated circuit having high-speed devices. In that case, the power consumption of the first Cordic 9 will be about one Watt. This appreciably exceeds the power consumption of an analog quadrature mixer-oscillator stage, which is functionally comparable to the first Cordic 9.

SUMMARY OF THE INVENTION

It is an object of the invention to provide a receiver having a digital quadrature processor which consumes less power than that in the known receiver. Such a receiver is defined in claim 1. In addition, the invention provides a digital signal processing arrangement as defined in claim 6, a quadrature decimation stage as defined in claim 7 and a method of processing digital signals as defined in claim 8. Advantageous embodiments are defined in the dependent claims.

Briefly stated, in the invention the sampling frequency of the digitized reception signal is reduced in the splitter. Accordingly, the digital quadrature mixer-oscillator can operate at a lower clock frequency and, will consequently, consume less power. Aliasing, due to the subsampling in the splitter, is prevented by a specific magnitude and phase relation between the transform functions of the splitter. This relation is such that a signal, which would otherwise alias, is phase-shifted substantially 90 degrees less by the first transform function than by the second transform function, while the magnitude of the signal is affected substantially identically.

The invention is based on the following recognition.

A distinction in terms of positive and negative frequencies can be made at the input of the digital quadrature processor. Said processor is either sensitive to positive frequency components or to negative frequency components within a specific band Q. With subsampling in the splitter, positive frequency components in a band X alias into this band Q, whereas negative frequency components in a band Y, which is the image of band X with respect to zero frequency, do not alias, or vice versa.

The amplitude balance between the positive frequency components in said band X and the negative frequency components in said band Y can be influenced by the mutual magnitude and phase characteristics of the transforms functions. Aliasing is prevented in that frequency components in the band which does not alias, Y or X, are maximized, while the frequency components in the band which does alias, X or Y, are minimized.

In principle, any type of filter may be used to implement said transform functions; only the mutual magnitude and phase characteristics of the filters are of interest. Due to the fact that the digital quadrature processor is band-limited, said mutual phase and magnitude characteristics only need to meet specific requirements in a limited frequency range so as to prevent aliasing. In many cases, the transform functions can be therefore implemented with relatively few circuit elements.

Advantageously, said transform functions are implemented as filters, in which the filter coefficients are determined by means for bit-shifting signal samples and, subsequently, for combining the bit-shifted signal samples. This is a hardware and/or software efficient alternative to the use of multipliers.

Advantageously, one of said transform functions has a symmetric impulse response and the other transform function has an anti-symmetric impulse response. This enables a hardware and/or software-efficient implementation of these transform functions. Relatively few scalings of signal samples are needed to provide the (anti-)symmetric impulse responses.

Advantageously, said digital quadrature processor comprises a quadrature decimation stage coupled between its input and further stages of the quadrature processor. This may further reduce the power consumption of said processor. By further reducing the sampling frequency of the split reception signal, said further stages can operate at a lower clock frequency.

These and other aspects of the invention will be apparent from and elucidated with reference to the embodiments described hereinafter.

BRIEF DESCRIPTION OF THE DRAWING

In the drawings:

FIGS. 4a–4b show subsampling aliasing.

FIGS. 9a–9e show frequency bands in this arrangement.

DESCRIPTION OF THE PREFERRED EMBODIMENTS

Figure 1:
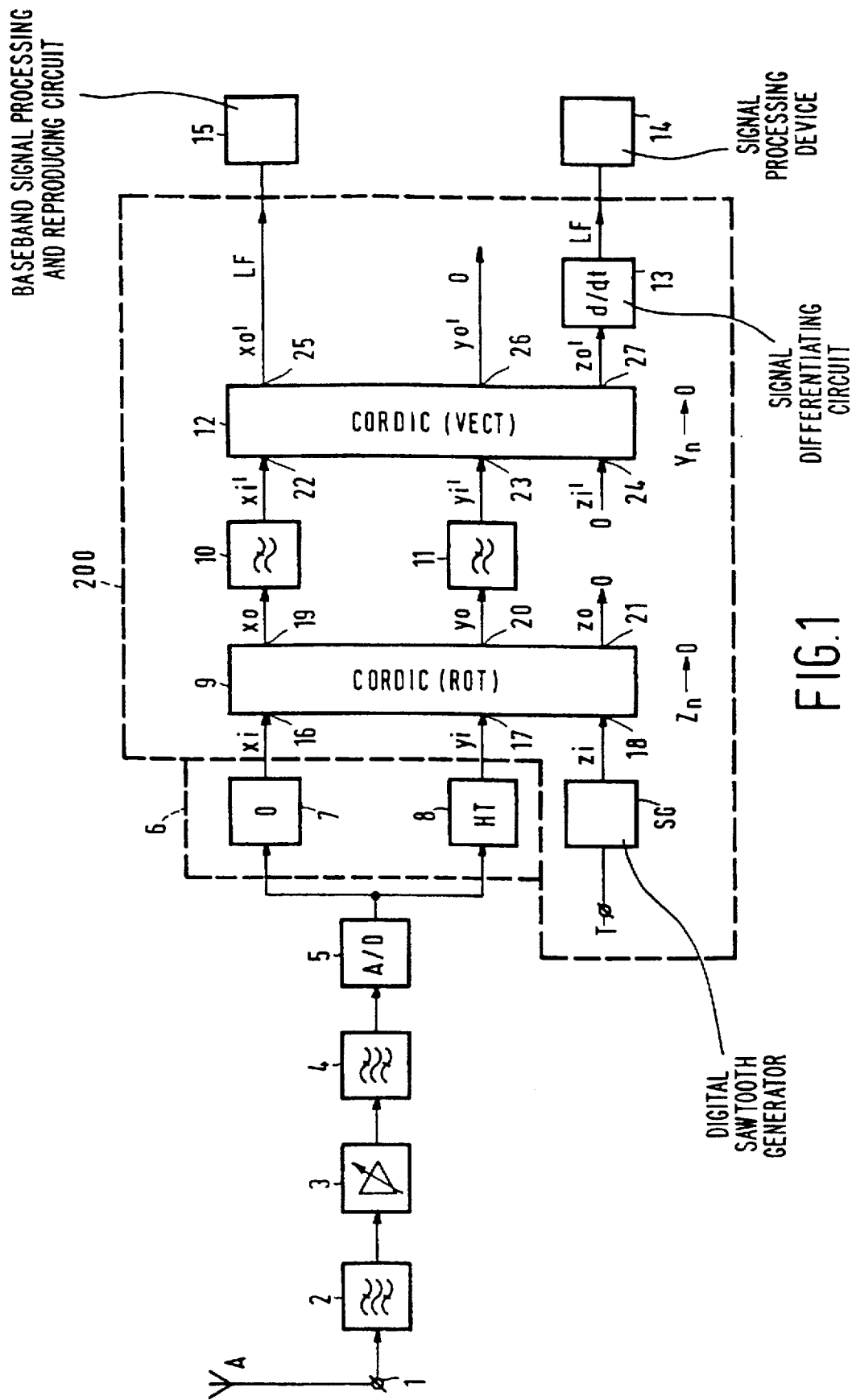
FIG. 1 shows a prior art receiver.

To explain the invention in greater detail, reference is made to the known FM broadcast receiver as disclosed in EP-A-0,486,095 and shown in FIG. 1. It will be evident that the invention may advantageously be used in many other receivers.

First, the drawbacks of two options for reducing the clock frequency of the first Cordic 9 will be discussed. Subsequent by, it will be shown that the invention provides an alternative in reducing the clock frequency which evades these drawbacks. Finally, advantageous embodiments are presented by way of example.

A first option for reducing the clock frequency of the first Cordic 9 is to lower the sampling frequency of the A/D converter 5. However, this requires more complicated analog filters in front of the A/D converter 5.

Figure 2A:
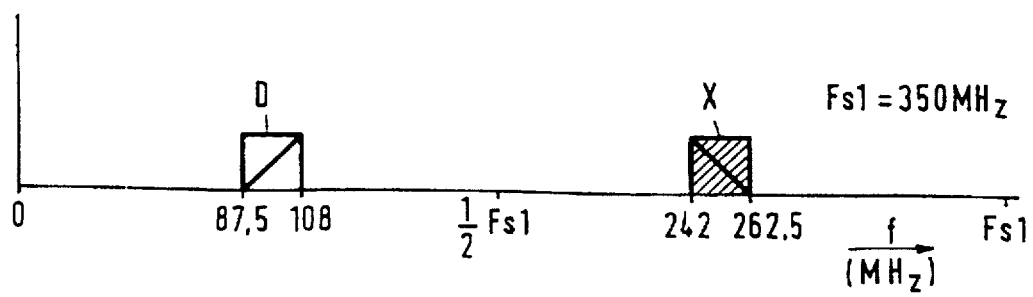
FIGS. 2a–2b show A/D conversion aliasing.
Figure 2B:
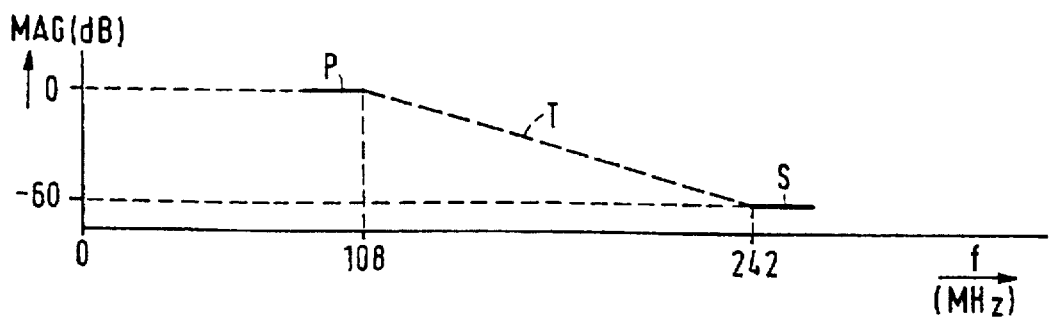
Figure 3A:
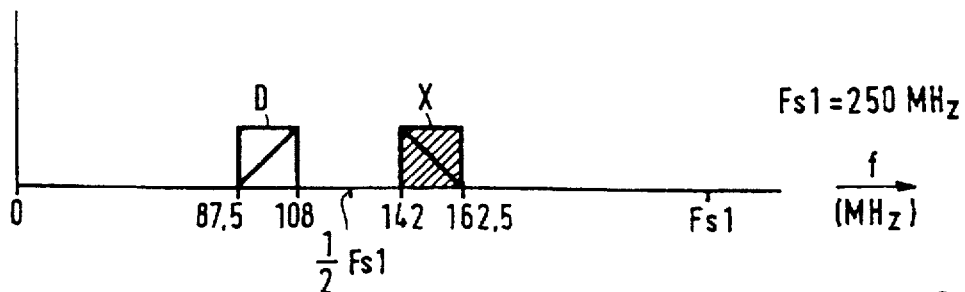
FIGS. 3a–3b show alternative A/D conversion aliasing.

This is illustrated in FIGS. 2 and 3. FIGS. 2a and 3a represent spectra at the input of A/D converter 5 for a sampling frequency of 350 MHz and 250 MHz, respectively. The spectra show frequency bands D and X. As a result of sampling, both bands are converted into a common frequency band at the output of the A/D converter 5. Desired band D corresponds to the FM broadcast band from 87.5 to 108 MHz. Frequency components in aliasing band X may interfere with a carrier in the desired band D. The desired band is indicated by a rectangle which encloses one straight diagonal line that interconnects two vertexes. The aliasing band has a dashed filling. The application will adhere to this representation of desired and aliasing bands.

Figure 3B:
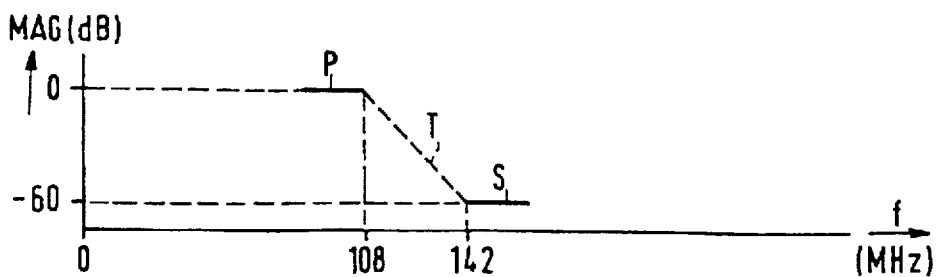

FIGS. 2b and 3b depict the desired frequency responses of the analog input section associated with an A/D converter sampling frequency of 350 MHz and 250 MHz, respectively. In both Figures there is a passband P that covers the desired band D and a stop band S that covers the aliasing band X. There is also a transition band T between the passband P and the stop band S. For a sampling frequency of 350 MHz the transition band is between 108 and 142 MHz (FIG. 2b). For a sampling frequency of 250 MHz, the transition band is between 108 and 142 MHz (FIG. 2b). In both cases, the desired roll-off in the transition band T is from 0 dB attenuation in the passband P to −60 dB in the stop band S. It can be seen that the roll-off is steeper for sampling frequency 250 MHz than for 350 MHz. Consequently, the order of analog filter 2 and/or filter 4 has to increase when the sampling frequency is lowered from 350 MHz to 250 MHz.

The sampling frequency of the A/D converter 5 is a compromise. There are penalties on increasing the sampling frequency, such as an increase in power consumption of the digital circuitry. On the other hand, there are penalties on lowering the sample frequency, such as in more complicated analog filters. It should be noted that such filters may bring further disadvantages, for example, increased sensitivity to component spread and less phase-linearity. Phase-linearity is of importance, for example, in television receivers.

A second option for reducing the clock frequency of first Cordic 9 is to insert a subsampling or decimating filter between the A/D converter 5 and the splitter 6. A decimating filter is a combination of a decimator and a digital filter that prevents aliasing as a result of decimation. A decimator is understood to be the element that transfers only one of a series of R subsequent samples of a digital signal at its input to an output. Such an element may be, for example, being a flip-flop operating at a clock frequency which is R times lower than the sampling frequency of the digital signal applied to the flip-flop input. Integer R will also be referred to as decimation factor.

As such, the known receiver comprises decimating filters: in filters 10 and 11, the quadrature output signal pair of the first Cordic 9 is subsampled. This is done to reduce the clock frequency of second Cordic 12. In general, a decimating filter is used to subsample a signal having a relatively high oversampling factor. The oversampling factor is the quotient of the sampling frequency and the width of the desired band in the signal. In the known receiver, the oversampling factor for filters 10 and 11 is relatively high. At the output of first Cordic 9, the sampling frequency is still 350 MHz, but the desired band is reduced to that of an FM-modulated carrier: 200 kHz. With such a high oversampling factor, the aliasing bands are distant in frequency from the desired band. As a consequence, aliasing can be prevented with relatively simple digital filters. This is somewhat similar to the relation between the sampling frequency of the A/D converter 5 and the complexity of the analog filters preceding it, as discussed above.

A decimating filter between the A/D converter 5 and splitter 6 will be rather impractical, due to the relatively low oversampling factor. At this point, the width of the desired band is 20.5 MHz, which causes the oversampling factor to be 100 times lower than that for filters 10 and 11. Note that the width of said desired band is defined by the tuning range of the first Cordic 9 and the pass-band of filters 10 and 11.

For example, consider a decimating filter with R=2 arranged between the A/D converter 5 (sampling frequency 350 MHz) and splitter 6. FIG. 4a represents a spectrum seen at the input of such a decimating filter. The spectrum comprises the desired band D from 87.5 MHz to 108 MHz, which will fold into a band from 87.5 to 67 MHz at the output of the decimating filter. There, it will coincide with the aliasing band X also shown in FIG. 4a. FIG. 4b shows the desired magnitude-frequency characteristic of the decimating filter. To prevent aliasing, there is a stop band S from 67 to 87.5 MHz; the passband covers the desired band D. The width of transition band T is 'zero': the decimating filter should have an infinite roll-off at 87.5 MHz. It is evident that such a decimating filter is not feasible.

Figure 5A:
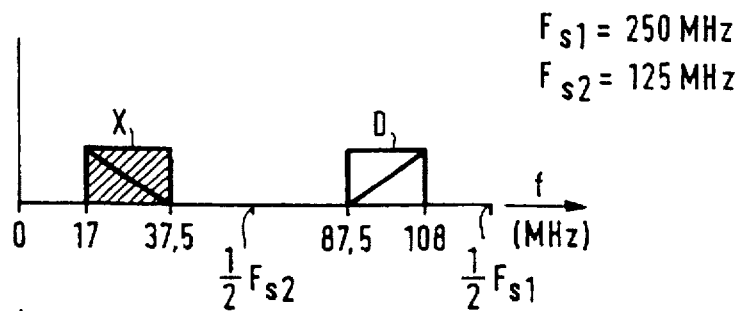
FIGS. 5a–5b show first alternative subsampling aliasing.
Figure 5B:
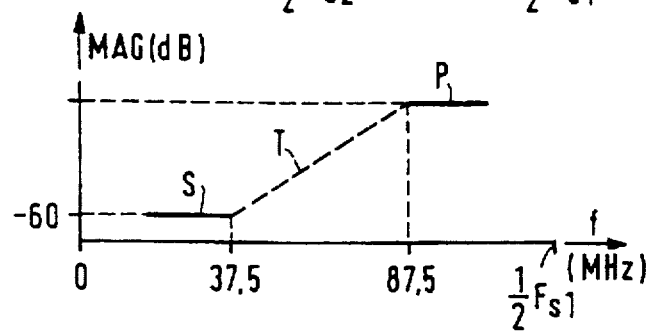

To circumvent a 'zero' transition bandwidth, one could adjust the sampling frequency of the A/D converter 5. The sampling frequency could be decreased to, for example, 250 MHz. FIGS. 5a and 5b show the corresponding spectrum and desired filter characteristic similar to FIGS. 4a and 4b, respectively. However, a decrease in sampling frequency necessitates the use of more complicated filters in the analog input section, as previously discussed.

Figure 6A:
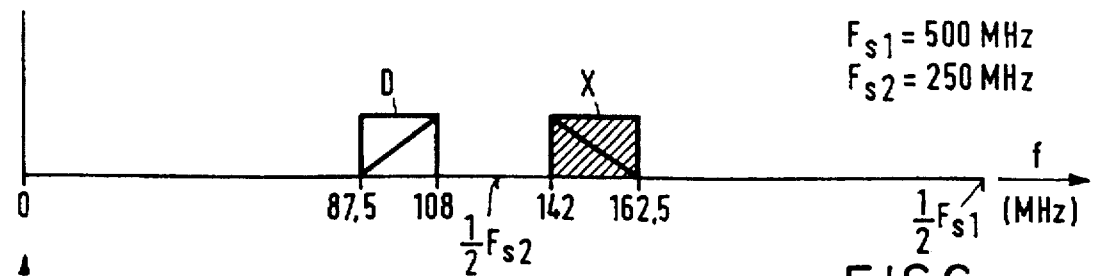
FIGS. 6a–6b show second alternative subsampling aliasing.
Figure 6B:
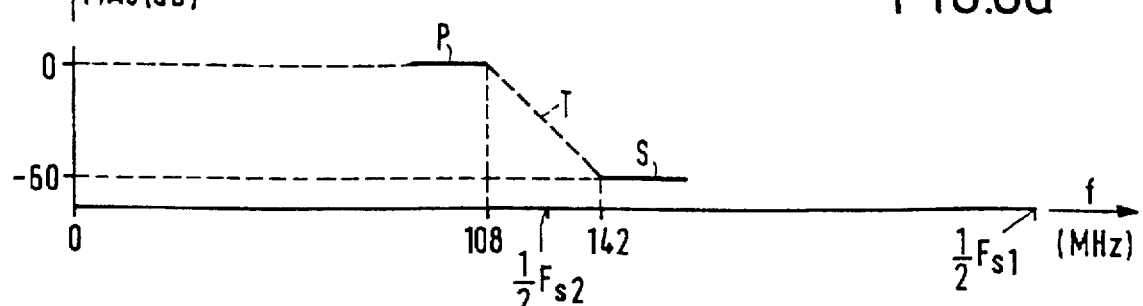

Alternatively, one could increase the sampling frequency of the A/D converter 5, for example, to 500 MHz. However, in that case the clock frequency of the first Cordic 9 is only reduced from 350 MHz to 250 MHz. The rather small saving in power consumption of first Cordic 9 may well be cancelled by the increase in power consumption of A/D converter 5 which has to operate at a clock frequency of 500 MHz. FIGS. 6a and 6b show the spectrum and desired filter characteristic similar to FIGS. 4a and 4b, respectively, for this case.

In either case, i.e. decreasing or increasing the sampling frequency, the decimating filter itself will consume an appreciable amount of power. A certain number of circuit elements will be needed to realize relatively sharp anti-aliasing filter characteristics as shown in FIGS. 5b and 6b. These circuit elements have to operate at a relatively high clock frequency and, consequently, need to be biased accordingly.

The invention provides an alternative option for reducing the clock frequency of the first Cordic 9 in the known receiver.

Figure 7A:
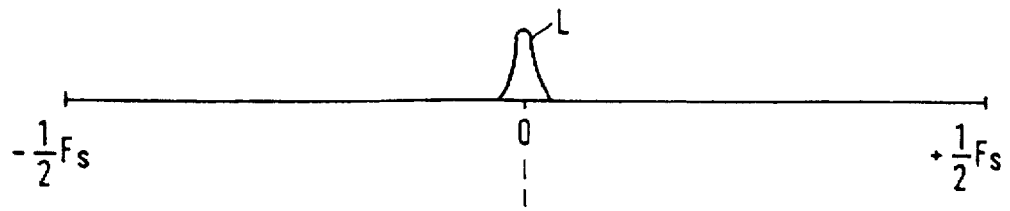
FIGS. 7a–7d show passband characteristics in the known receiver.
Figure 7B:
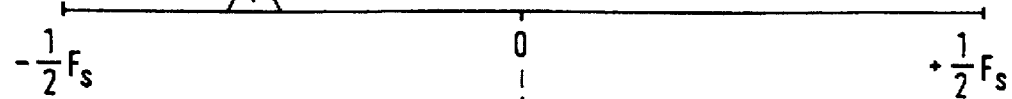

The invention advantageously uses the following property of the known receiver shown in FIG. 1. Seen at the pair of inputs 16, 17, the quadrature signal processor 200 in the known receiver has a passband. This passband is either positive or a negative frequency shift of the passband of filters 10 and 11. For example, let both filters 10 and 11 provide a low-pass characteristic L as shown in FIG. 7a and let first Cordic 9 shift the spectrum at the pair of inputs 16, 17 over a frequency +ΔF. The corresponding passband M at said inputs is depicted in FIG. 7b. Only signal components in this passband M will be converted into the passband L of filters 10 and 11. There is no positive frequency image of passband M. The invention advantageously uses this asymmetry in passband characteristic with respect to zero frequency.

Figure 7C:
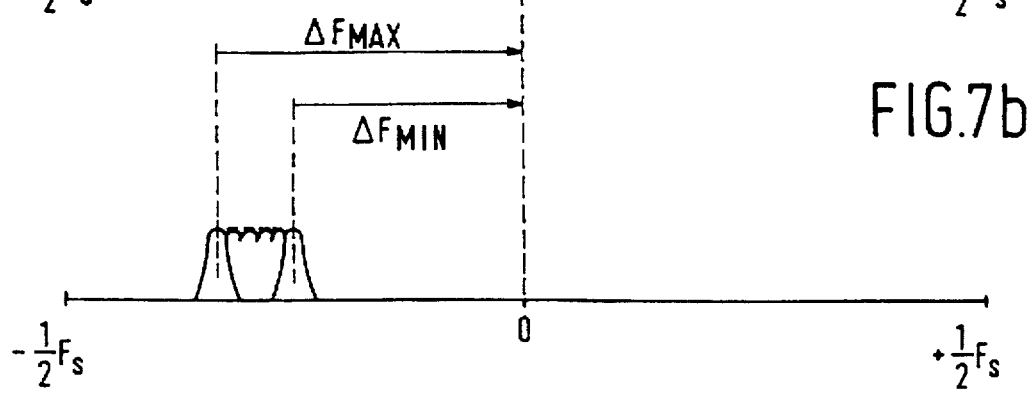
Figure 7D:
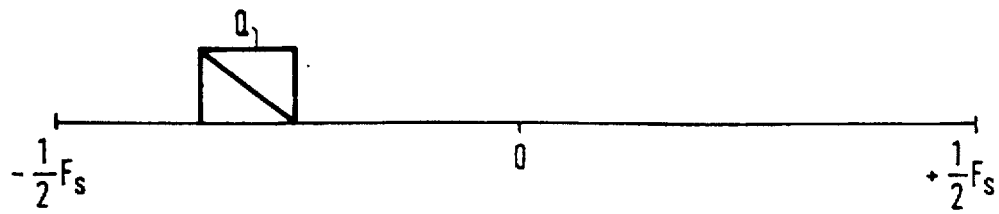

FIG. 7c depicts the various locations of passband M seen at the pair of inputs 16, 17 when the first Cordic 9 is tuned from minimum shift frequency (+ΔFmin) to maximum shift frequency (+ΔFmax). It is possible to define a processor band Q which covers all possible locations of passband M. This processor band Q is shown in FIG. 7d. Thus, quadrature signal processor 200 can process signals within this processor band Q which is located asymmetrically with respect to zero frequency.

Figure 8:
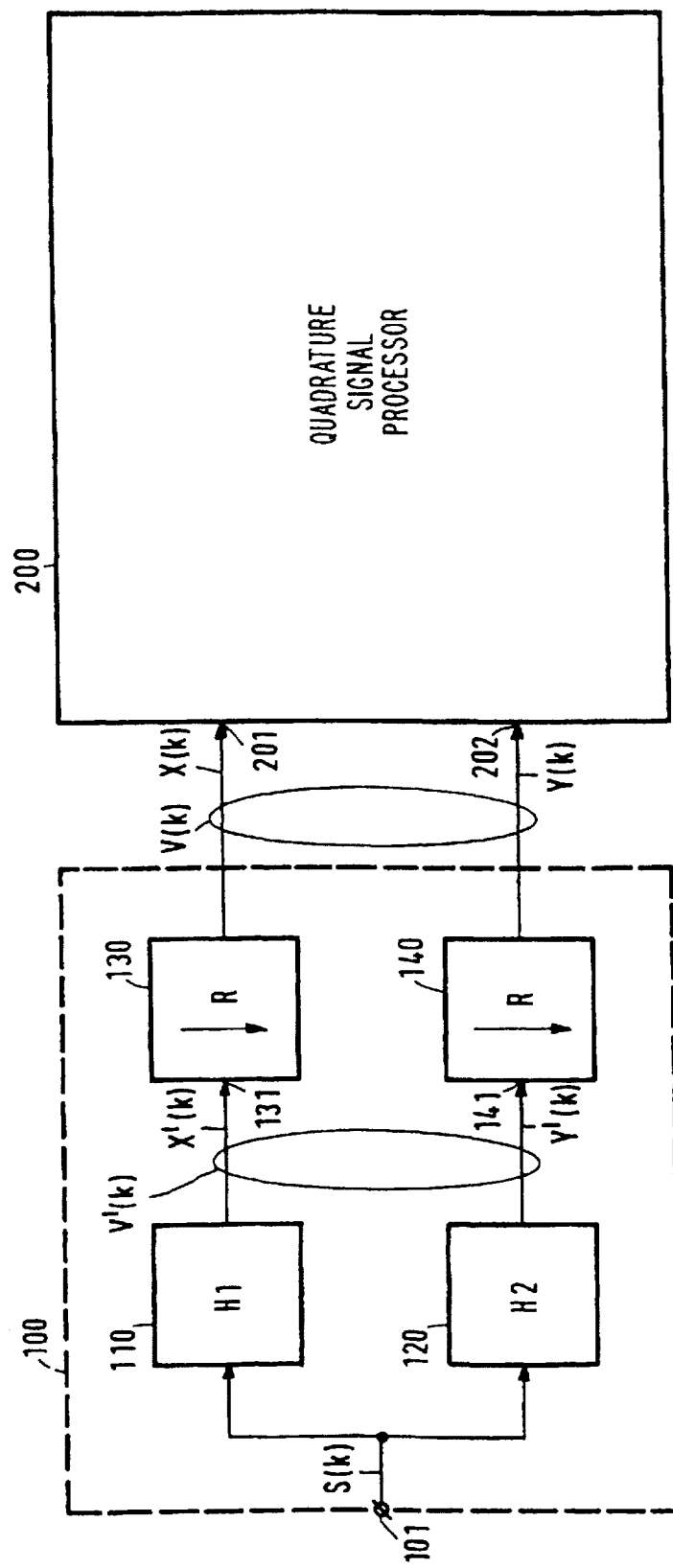
FIG. 8 shows a digital signal processing arrangement according to the invention.

The invention uses the above-identified asymmetry of processor band Q in a manner which is further explained with reference to FIG. 8. FIG. 8 shows a signal processing arrangement comprising a digital quadrature signal processor 200 preceded by a splitter 100. The quadrature signal processor 200 processes signals within a processor band Q as shown in FIG. 9a. The quadrature signal processor 200 may be similar to that in the known receiver shown in FIG. 1. However, this is not essential to the invention.

The splitter comprises transform stages 110 and 120 with transform functions H1 and H2, respectively, followed by decimators 130 and 140, respectively. A digital signal received at input 101 of splitter 100 is passed to a first input 201 and a second input 202 of the digital quadrature signal processor 200 in accordance with the first transform function H1 and the second transform function H2, respectively.

Further, the sampling frequency Fs1 at the input 101 is reduced by a decimation factor R to a sampling frequency of Fs2=Fs1÷R at the pair of inputs 201, 202.

Seen at the pair of inputs 131, 141 of decimators 130 and 140, there is a multitude of R frequency bands which are converted to the processor band Q shown in FIG. 9a. These frequency bands are frequency shifts of the processor band Q over an integer (k) times the output sampling frequency Fs2=Fs1÷R of decimators 130 and 140, including the processor band Q itself: (k=0). In general, the spectrum seen at the pair of inputs 131, 141 can be established in the following manner. First, a frequency interval is defined in accordance with the sampling frequency Fs1=R•Fs2 at said pair of inputs. Secondly, the spectrum at inputs 201, 202 is repetitively shifted over one sample frequency to fill this interval. By way of example, FIG. 9b shows two bands Q'(0) and Q'(+1) at the pair of inputs 131, 141 that are converted to processor band Q shown in FIG. 9a in the case that R=2. Band Q'(0) corresponds to processor band Q in FIG. 9a, that is: Q'(0) is a zero frequency shift of processor band Q (k=0). Band Q'(+1) is a frequency shift of processor band Q in FIG. 9a over +Fs2 (k=+1).

Only one of the multitude of R frequency bands seen at the pair of inputs 131, 141 is desired, namely the frequency band that corresponds to the band in which desired signals may be located. Signals in the other R−1 frequency bands, referred to as aliasing bands, may interfere with a signal in the desired band as a result of decimation. For example, desired signals may be located in the band Q'(+1) shown in FIG. 9b. This is illustrated in FIG. 9c which shows the desired band D and the aliasing band X seen at the pair of inputs 131, 141 in accordance with this example. To prevent aliasing, the occurrence of signals in band X should be prevented.

The occurrence of a signal in an aliasing band at the pair of inputs 131, 141 can be prevented by means of the following relationship between the first transform function H1 and the second transform function H2. In the aliasing band, the phase characteristic of H1 should be 90 degrees lagging with respect to that of H2. Furthermore, the magnitude characteristics of H1 and H2 should match in the aliasing band. In that case a signal at input 101 cannot produce frequency components in the aliasing band. This can be explained as follows.

Figure 10A:
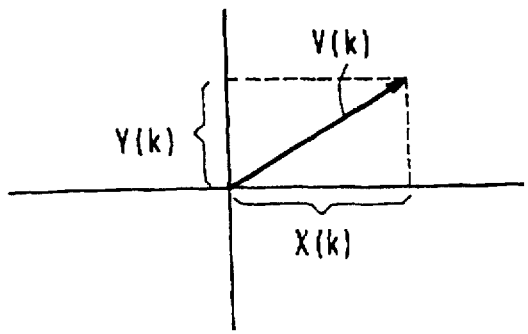
FIGS. 10a–10c show vectorial signals in this arrangement.

First, it should be recognized that the digital quadrature signal processor 200 receives signals x(k) and y(k) at inputs 201 and 202, respectively, as rectangular coordinates of a vectorial signal v(k). This is visualized in FIG. 10a in which sample x(n) is represented on the horizontal axis and sample y(n) on the vertical axis. Accordingly, the sample pair x'(n) and y'(n) at the input pair 131, 141 constitute the rectangular coordinates of a vector v'(n).

Figure 10B:
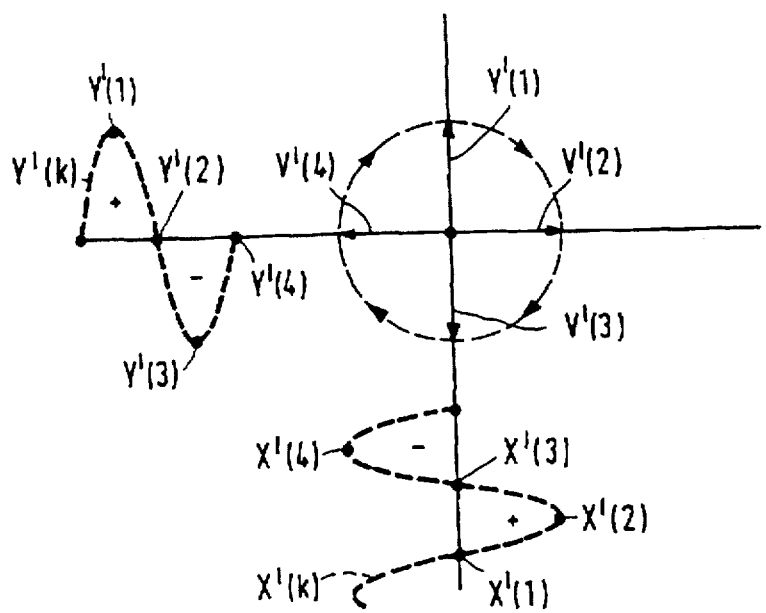
Figure 11A:
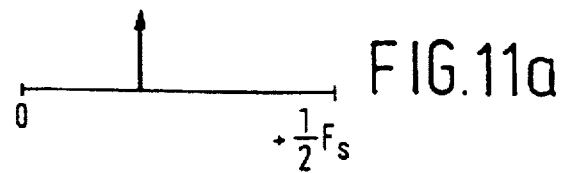
FIGS. 11a–11c show spectra of signals in this arrangement.

Now, let the signal s(k) at input 201 be a digitized sinusoidal signal whose spectrum is shown in FIG. 11a. Further, let the phase shift of s(k) by the first transform stage 110 be 90 degrees lagging with respect to that by the second transform stage 120, while the magnitude characteristics of these stages are equal. FIG. 10b illustrates the corresponding vectorial signal v'(k) at the pair of inputs 131, 141. Subsequent samples x'(1) to x'(4) from the first transform stage 110 are projected on the x-axis, whereas the subsequent samples y'(1) to y'(4) from the second transform stage 120 are projected on the y-axis.

Figure 11B:
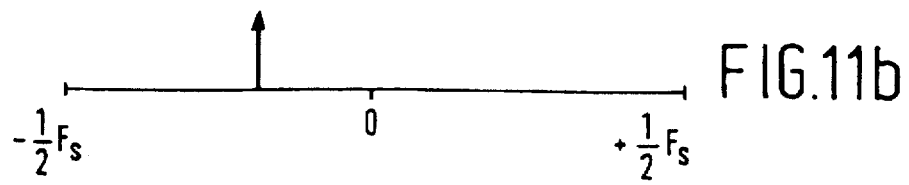

It appears that the vectorial signal v'(k) at the pair of inputs 131, 141 is a circular clockwise rotation. The spectrum of this vectorial signal is shown in FIG. 11b; it only comprises a negative frequency component. This negative frequency component is the image with respect to zero frequency of the frequency component of input signal s(k) shown in FIG. 11a. Apparently, at the pair of inputs 131, 141 the occurrence of a positive frequency component equal to the frequency component shown in FIG. 11a has been prevented.

Figure 10C:
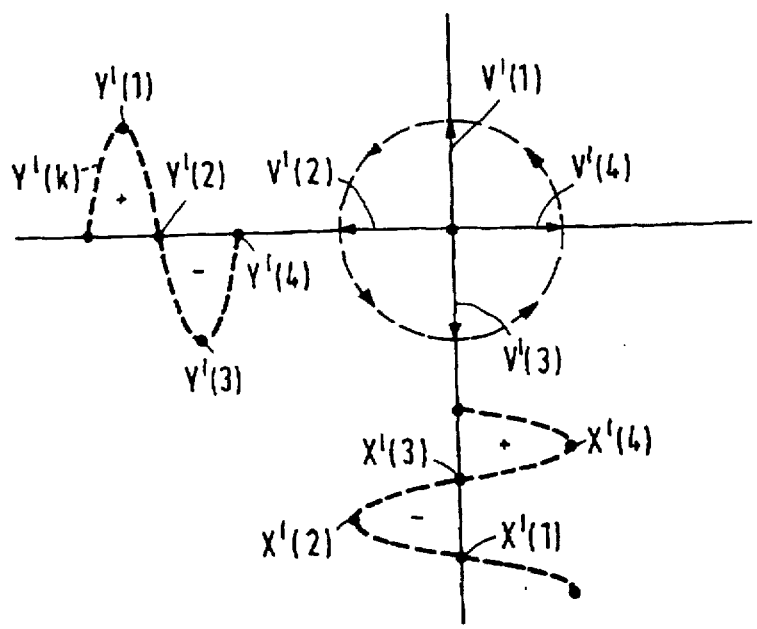
Figure 11C:
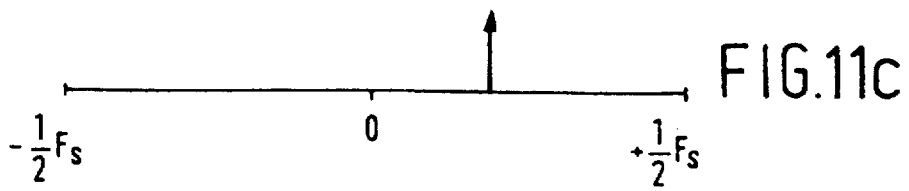

The opposite is shown in F10c in which signal x'(k) leads 90 degrees in phase with respect to signal y'(k). The vectorial signal v'(k) in FIG. 10c is a circular counter-clockwise rotation. Consequently, it only comprises a positive frequency component as shown in FIG. 11c. The occurrence of the negative frequency image is prevented.

The selective translation of a signal s(k) to either a positive or a negative frequency at the pair of inputs 131, 141 can be used to prevent aliasing. This is due to the fact that the processor band Q has no image with respect to zero frequency and, as a result, there are no aliasing bands which are each other's images with respect to zero frequency. For example, consider the case shown in FIG. 9c. It can be arranged that signal components occur in a band Y shown in FIG. 9d instead of in aliasing band X. Band Y is the image of aliasing band X. Since band Y does not coincide with an aliasing band and falls outside the desired band D, these signal components cannot cause any interference.

The invention provides as a general rule a substantially 90 degrees phase lag of H1 with respect to H2 together with substantially identical magnitudes in an aliasing band. This applies both to aliasing bands in the positive frequency half as well as to or aliasing bands in the negative frequency half, for example aliasing band X in FIG. 9d. It is a fundamental property that phase characteristics are anti-symmetrical with respect to zero frequency. Hence, said rule implies a phase lead of H1 with respect to H2 in the band Y shown in FIG. 9d. According to said rule, a sinusoidal signal s(k) whose negative frequency image would fall in the aliasing band X is translated to a vectorial signal as shown in FIG. 10c.

The above-identified technique of preventing aliasing is notably advantageous when an aliasing band is close to the desired band seen at the input 101 of the splitter. FIG. 9e shows the spectrum seen at the input 101 which corresponds to the spectrum of FIG. 9c. Aliasing could also be prevented if both transform stages 110 and 120 in FIG. 8 have stop bands that cover the aliasing band X shown in FIG. 9e. However, since the aliasing band X is close to the desired band D, this would require complicated filter structures. The invention provides an alternative for this.

It should be noted that it is not required to use the above-identified technique for each aliasing band. If an aliasing band is sufficiently far from the desired band, it may be practical for each of the transform functions to have a stop band which covers this aliasing band. Alternatively, a single filter in front of the splitter could provide this stop band.

Receivers according to the invention will now be presented by way of example.

Figure 12:
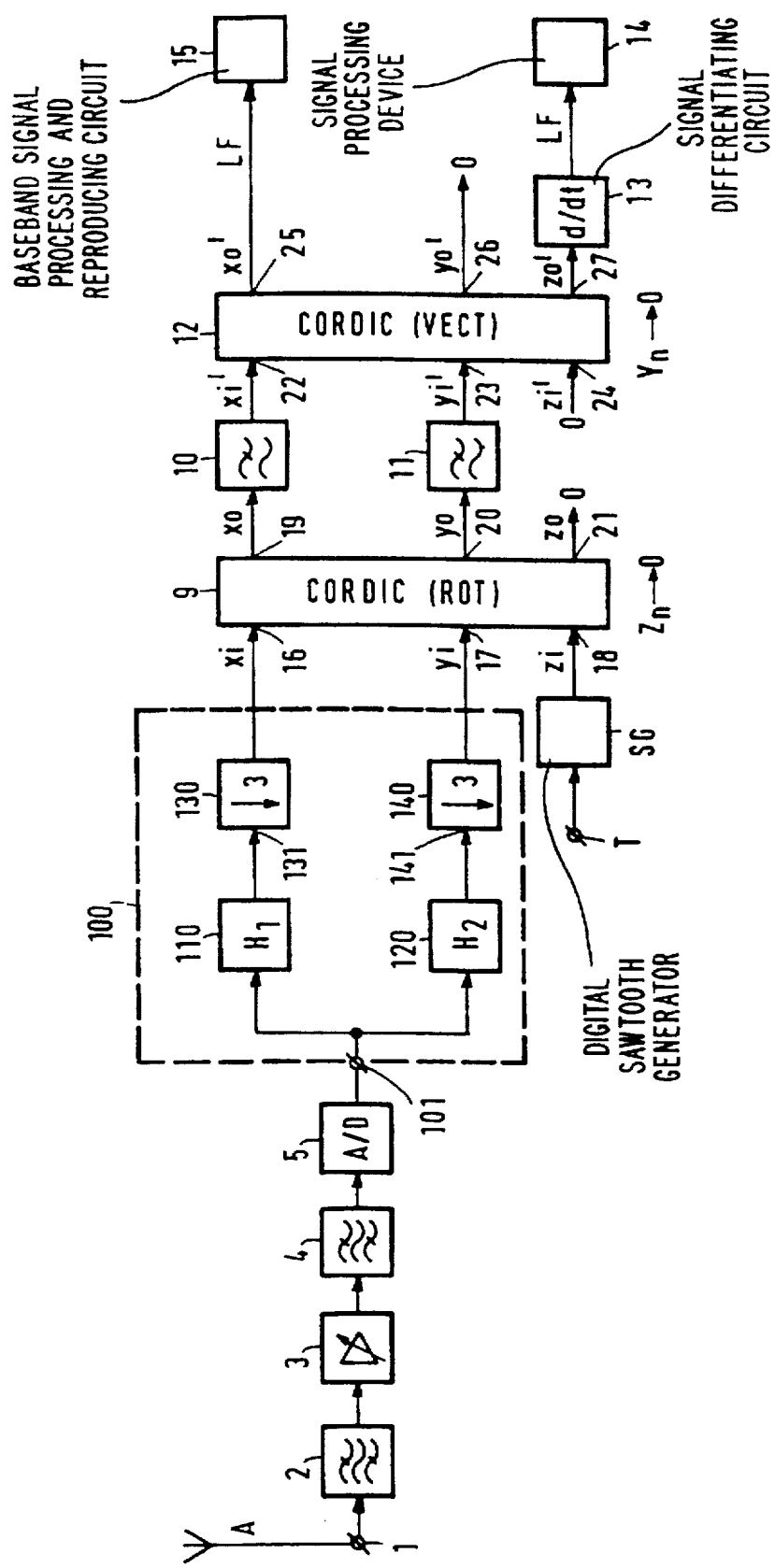
FIG. 12 shows a first receiver according to the invention.

FIG. 12 shows an FM broadcast radio receiver which has a structure similar to the receiver shown in FIG. 1. Corresponding elements are denoted by the same reference numerals in FIG. 1. The sampling frequency of A/D converter 5 is 375 MHz. A splitter 100 comprising two decimators 130 and 140, respectively, both having a decimation factor R=3 is arranged between A/D converter 5 and first Cordic 9. Accordingly, the clock frequency of the first Cordic 9 is 125 MHz, i.e. one-third of the A/D converter sampling frequency.

Figure 13A:
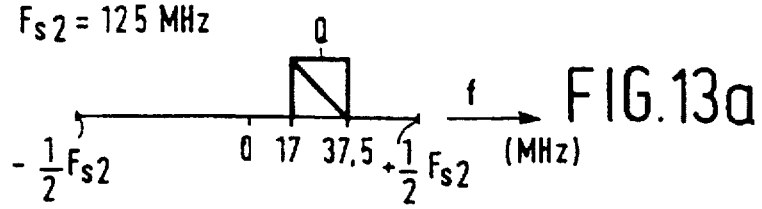
FIGS. 13a–13e show frequency characteristics of this receiver.

Filters 10 and 11 are decimating low-pass filters which have a cut-off frequency of 100 kHz. The frequency shift by the first Cordic 9 is tuned from −17.1 MHz to −37.4 MHz. FIG. 13a shows the desired band at the input of the first Cordic 9 which ranges from +17 MHz to +37.5 MHz. Signals within this band can be shifted within the passband of filters 10 and 11.

Figure 13B:
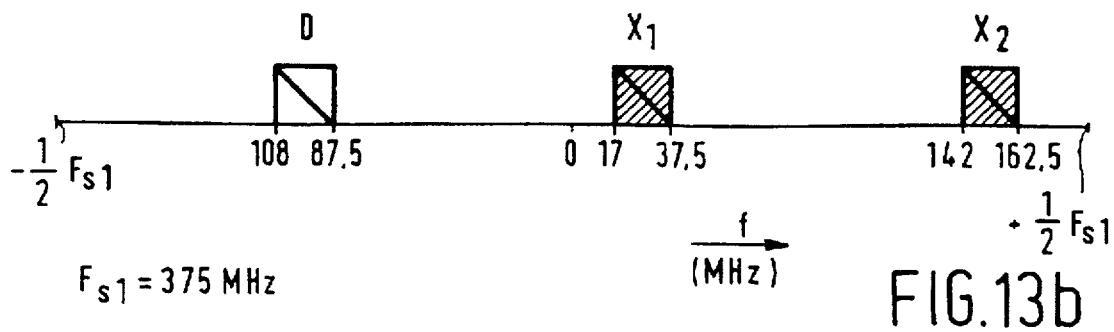

At the input pair 131, 141 there are three frequency bands which are converted into this desired band as a result of decimation. These frequency bands are shown in FIG. 13b. They correspond to frequency shifts of an integer times the sampling frequency at the output of decimators 130 and 140, which is 125 MHz. One of these frequency bands is the desired FM broadcast band from −87.5 to −108 MHz. The other two frequency bands are aliasing bands.

The occurrence of a frequency component in the above identified aliasing bands is prevented by the transform stages 110 and 120. As an example, transform stages 110 and 120 are in the form of transversal filters. These filters provide transform functions which, in the z-notation, can generally be expressed as follows:

$$H(z) = \sum_{n=0}^{L} c_n z^{-n}$$

L denotes the length of the transform function. Both transform stages 110 and 120 have length L=6. The coefficients of the first transform stage 110 are:

c0=−0.015625
c1=−0.156250
c2=0.187500
c3 =0.187500
c4=−0.156250
c5=−0.015625

The coefficients of the second transform stage 120 are:

c0=−0.062500
c1=0.093750
c2=0.234375
c3=−0.234375
c4=−0.093750
c5=0.062500

Figure 13C:
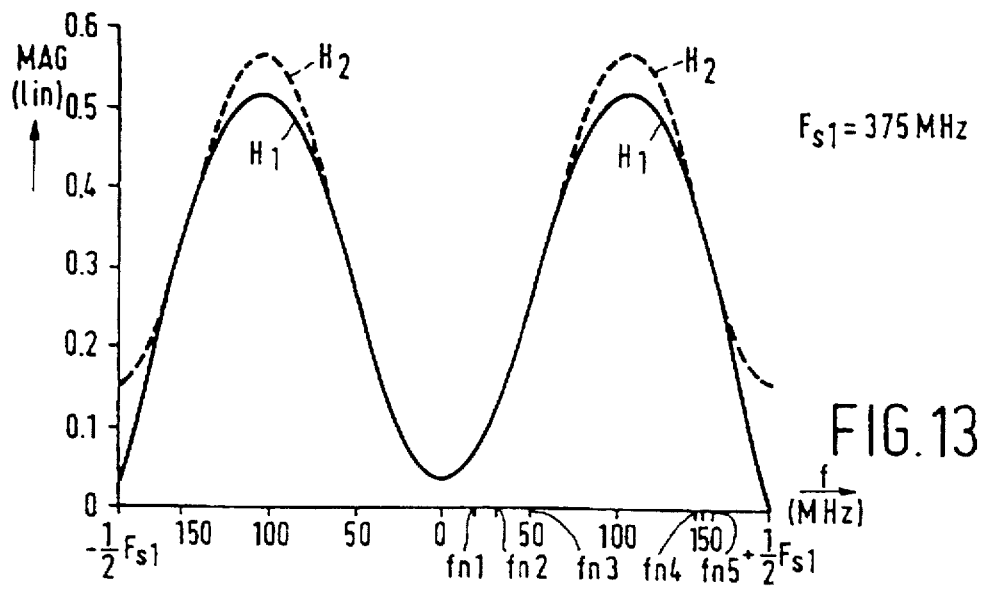
Figure 13D:
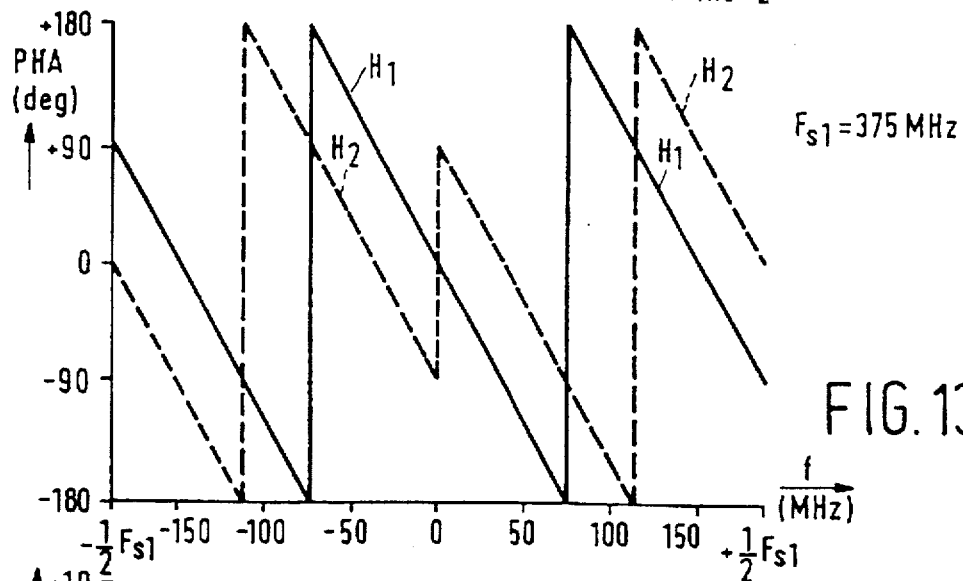

FIG. 13c shows the magnitude characteristics mag{H1} and mag{H2} of the first and second transform stages 110 and 120, respectively. FIG. 13d shows the phase characteristics pha{H1} and pha{H2}. The magnitude characteristics are substantially equal in the aliasing bands. For positive frequencies, the phase characteristic pha{H1} is precisely 90 degrees lagging with respect to phase characteristic pha{H2}. For negative frequencies, the sign of the phase difference changes, that is, pha{H1} is leading 90 degrees with respect to pha{H2}. Note the symmetry with respect to zero frequency of the magnitude characteristic and the anti-symmetry of the phase characteristic. Since the (anti-) symmetry applies to all filters, it would have been sufficient to only display the magnitude and phase characteristics for positive frequencies, that is from 0 to +375 MHz.

There are five frequencies fn1 . . . fn5 for which the magnitudes of H1 and H2 are exactly the same, while the phase of H1 is lagging 90 degrees. If a sinusoidal signal with any of the frequencies fn1 . . . fn5 is applied at input 101, it will result in a vectorial signal at the pair of inputs 131, 141 which is a purely circular clockwise rotation. Hence, there is no positive frequency component, but only a negative frequency component.

For frequencies other than fn1 ... fn5, a sinusoidal input signal will produce a vectorial signal at the pair of inputs 131, 141 which is not perfectly circular, but rather elliptical. The elliptical rotation is a vectorial sum of a clockwise rotation and a counter-clockwise rotation. Hence, the vectorial signal comprises both a positive and a negative frequency component. The magnitude of the positive and negative frequency components corresponds to the radius of said counter-clockwise and clockwise rotations, respectively. The more mag{H1} and mag{H2} match, the more the vectorial signal will approximate a perfectly circular rotation, and consequently, the more one of the frequency components is suppressed.

Figure 13E:
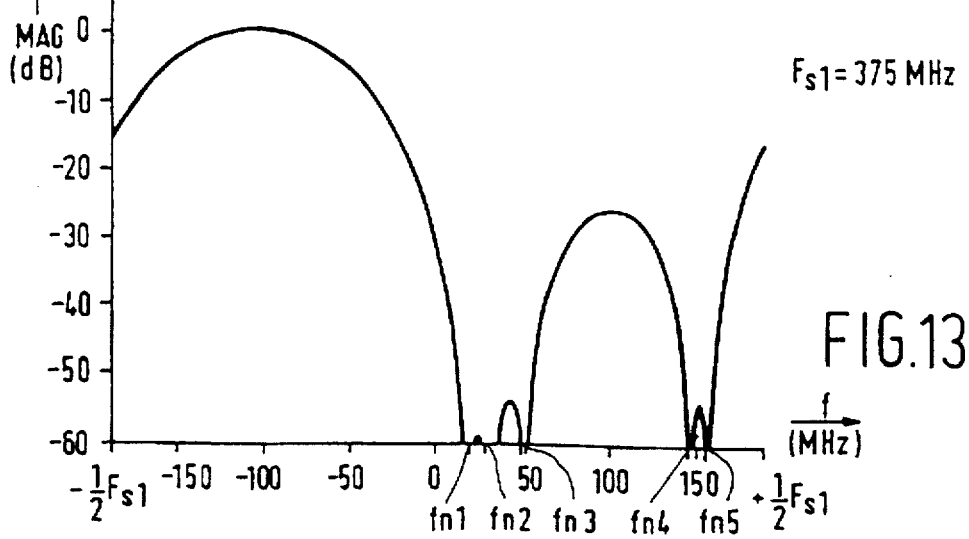

For all frequencies, FIG. 13e shows the magnitude of positive and negative components at the pair of inputs 131, 141 which correspond to a sinusoidal signal at input 101. Note the notches at frequencies fn1 ... fn5 in the aliasing bands. Due to the fact that the difference between mag{H1} and mag{H2} is relatively small in the aliasing bands, the frequency components in these bands are at least 40 dB attenuated with respect to the desired band. By comparing FIG. 13c with FIG. 13e, the relation between the magnitude of a positive frequency component and the matching of the magnitude characteristics is apparent. If more attenuation in the aliasing band is required, the mismatch between the magnitude characteristics should be reduced. This can be achieved, for example, by using filters whose length is more than 6.

It is important to note that in the invention the suppression of frequency components outside the aliasing bands is of no interest. These frequency components will be suppressed, for example, by the filters 10 and 11 behind the first Cordic 9 in the receiver shown in FIG. 12. Thus, the presence of these filters relaxes the requirements on the magnitude and phase characteristics in the splitter.

Figure 14:
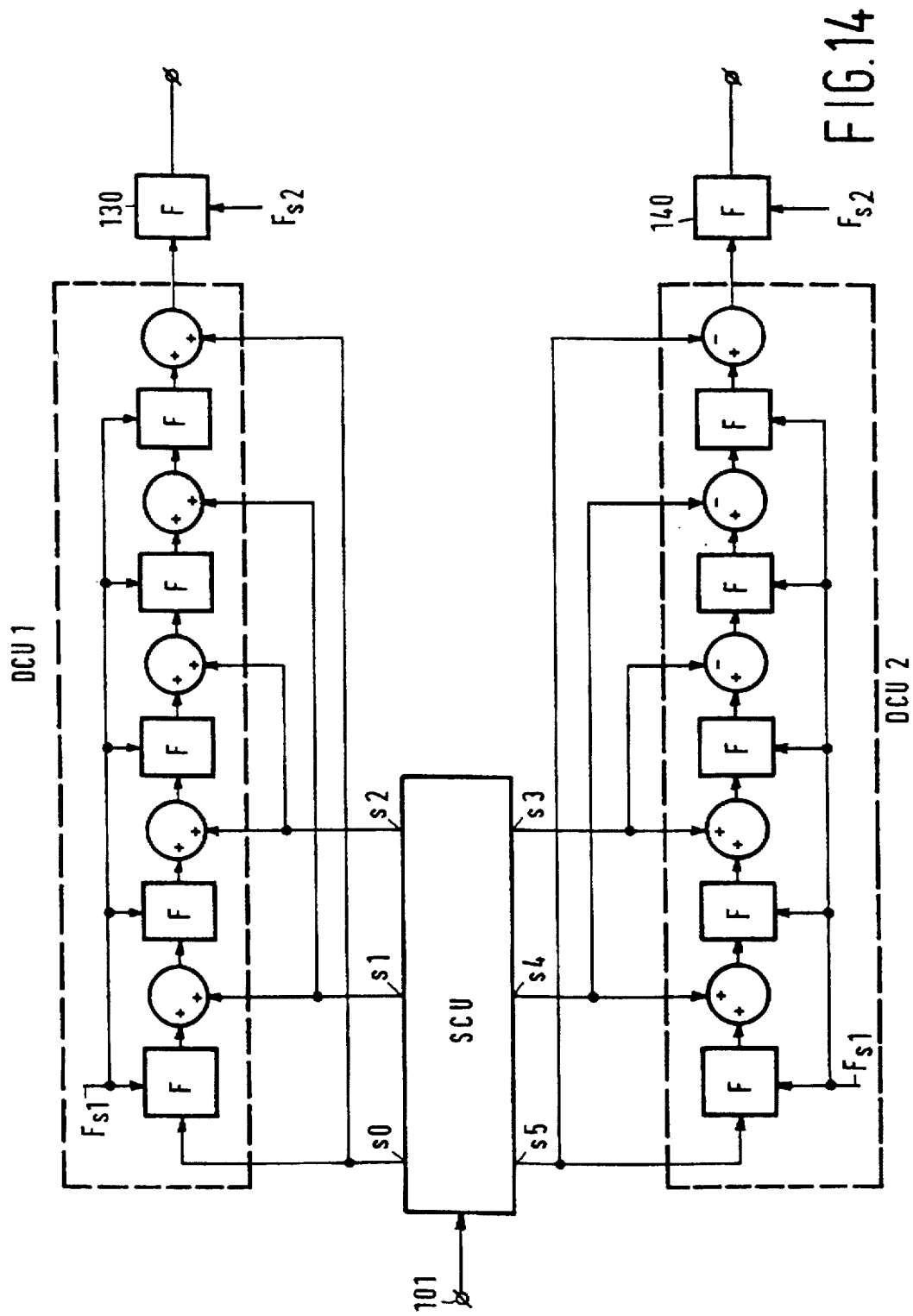
FIG. 14 shows an embodiment of a splitter.

FIG. 14 illustrates an embodiment of the splitter 100. In the scaling unit SCU the input samples are scaled in accordance with the coefficients in the systems functions H1(z) and H2(z). The scaled input samples are supplied to two delay and combination units DCU1 and DCU2, respectively. The output signals of DCU1 and DCU2 are decimated by decimators 130 and 140, respectively. Decimators 130 and 140 are flip-flops, represented by a square with an 'F' inside, which operate at a clock frequency of 125 MHz. All the other flip-flops operate at a clock frequency of 375 MHz and serve as unit delay elements. A unit delay element corresponds to a $z^{-1}$ operation in the z-domain.

Advantageously, the filter coefficients are determined by means for bit-shifting signal samples and, subsequently, for combining the bit-shifted signal samples. This allows a hardware-efficient realisation of the scaling unit SCU in which no multipliers are used. The coefficients of the transform function H1(z) can be written as:

$c0=c5=-2^{-6}$ $c1=c4=-2^{-3}-2^{-5}$ $c2=c3=2^{-2}-2^{-4}$

The coefficients of the transform function H2(z) can be written as:

$c0=-c5=-2^{-4}$ $c1=-c4=2^{-3}-2^{-5}$ $c2=-c3=2^{-2}-2^{-6}$

A sample is scaled with $2^n$ when the bits in a sample are shifted n bit-positions in the direction from the least significant bit position to the most significant bit position. Alternatively, a sample is scaled with $2^{-n}$ when the bits in a sample are shifted n bit-positions in the direction from the most significant bit position to the least significant bit position. These operations will further be referred to as n bit shifts and −n bit shifts, respectively.

The coefficients of H1(z) and H2(z) correspond to adding and/or subtracting a plurality of these bit shifts. For example, coefficient c1 of H1(z) can be realised as a linear combination of a −3 bit shift and a −5 bit shift. Since it will be clear to a person skilled in the art how to implement linear combinations of bit shifts, constructional detail of the scaling unit SCU are not shown in FIG. 14.

Advantageously, the transform functions H1(z) and H2(z) are symmetrical and anti-symmetrical, respectively. Therefore, only three scalings for each transform function are needed, which is half the length of these functions. The scaling unit SCU provides at outputs s1, s2, s3, s4, s5 and s6 input samples which are scaled with a factor equal to coefficients c0, c1, c2 of H1(z) and c3, c4 and c5 of H2(z), respectively. The scaled samples at outputs s0, s1 and s2 are supplied to the first delay and combination unit DCU1, those at outputs s3, s4 and s5 to the second unit DCU2. Both units DCU1 and DCU2 are series arrangements of flip-flops between which an adder or a subtracter is arranged. In DCU2 three subtracters are used to provide the desired anti-symmetry of the transform function H2(z). By considering each flip-flop in the delay and combination units DCU1 and DCU2 as a $z^{-1}$ operator one can readily verify that the embodiment shown in FIG. 14 provides the desired transform function H1(z) and H2(z), respectively.

Now referring to the receiver shown in FIG. 12, it is possible to further reduce the clock frequency of first Cordic 9. The desired band at the input of the first Cordic 9, shown in FIG. 13a, still occupies a relatively small portion of the total spectrum from −½Fs2 to +½Fs2. This is an indication of the overhead in sampling frequency.

Figure 15:
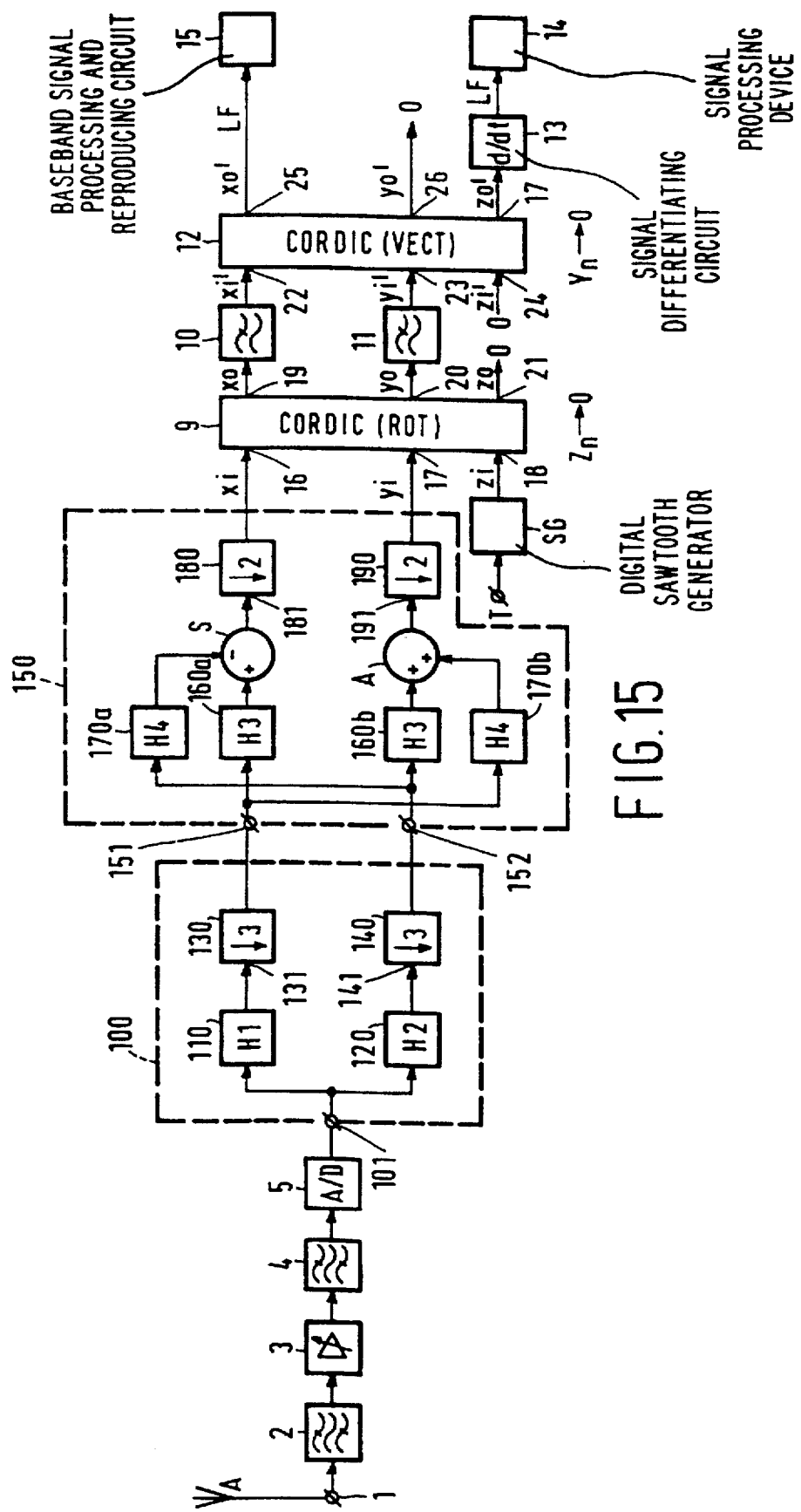
FIG. 15 shows a second receiver according to the invention.

FIG. 15 shows an FM broadcast receiver in which the clock frequency of the first Cordic 9 is reduced to 62.5 MHz. Compared to FIG. 12, a quadrature decimating filter 150 with R=2 is arranged between the splitter 100 and the first Cordic 9. From the A/D converter 5 to the first Cordic 9, the effective decimation factor is 6. The systems functions H1(z) and H2(z) of the splitter 100 are the same as in the receiver shown in FIG. 12.

The frequency shift by the first Cordic 9 is tuned from −25.1 to −31.25 MHz and from +31.25 to +17.1 MHz. FIG. 16a shows the desired band at the input of the first Cordic 9. It ranges from −25 to −31.25 MHz and from +31.25 to +17 MHz. The suggested discontinuity between + and −31.25 MHz, half the sampling frequency, is a result of the way of presentation. The spectrum of FIG. 16a repeats itself each sampling frequency shift.

FIG. 16b shows the spectrum seen at the pair of inputs 181, 191 of decimators 180 and 190, respectively. There are two bands which convert to the desired band at the input of first Cordic 9. One of these bands corresponds to the desired band shown in FIG. 13a, the other band is an aliasing band. The occurrence of frequency components within the aliasing band at the pair of inputs 181, 191 is prevented by the transform stages 160a, 160b and 170a, 170b. The transform function of stages 160a and 160b is H3 and that of stage, 170a and 170b is H4. The transform stages are transversal filters of length L=4. The coefficients of H3 are:

$c0=c3=0.06250=2^{-4}$ $c1=c2=-0.28125=-2^{-2}-2^{-5}$

The coefficients of H4 are:

$c0=-c1=0.109375=2^{-3}-2^{-6}$ $c1=-c2=0.234375=2^{-2}-2^{-6}$

A negative frequency component at the input of the filter/decimator stage 150 is formed by a first sinusoidal signal at input 151 and a second sinusoidal signal at input 152 which has the same magnitude as the first sinusoidal signal but leads 90 degrees in phase. Both sinusoidal signals are transferred according to H3 and H4, respectively, and combined in subtracter S and adder A, respectively. If H3 phase shifts the first sinusoidal signal with a 90 degrees lead with respect to H4, the transferred signals will be identical at the inverting and non-inverting inputs of subtracter S and will consequently cancel each other. At the inputs of adder A the transferred signals will be phase opposite but have the same magnitude.

Figure 16C:
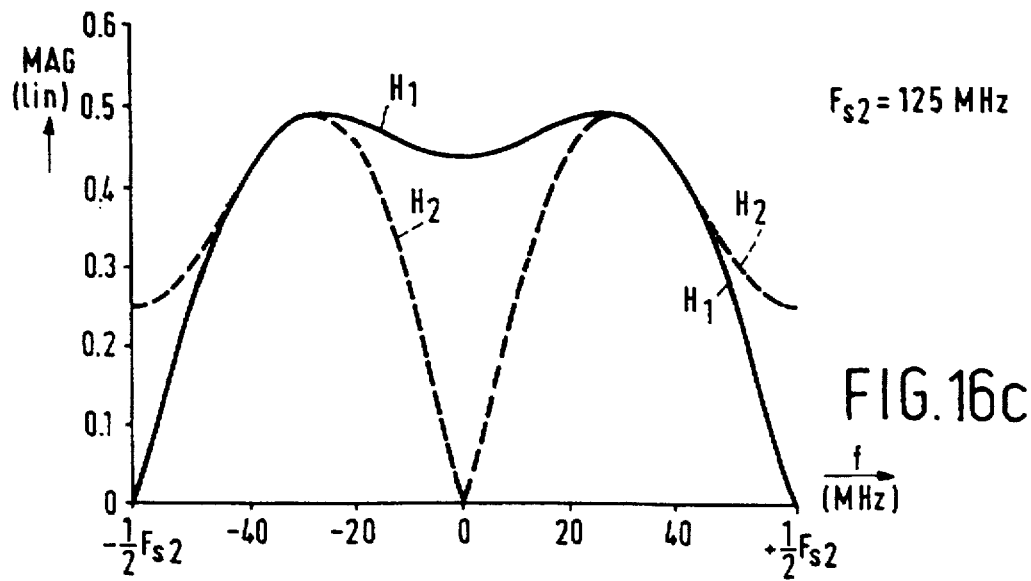
FIGS. 16a–16c show frequency characteristics of this receiver.
Figure 16D:
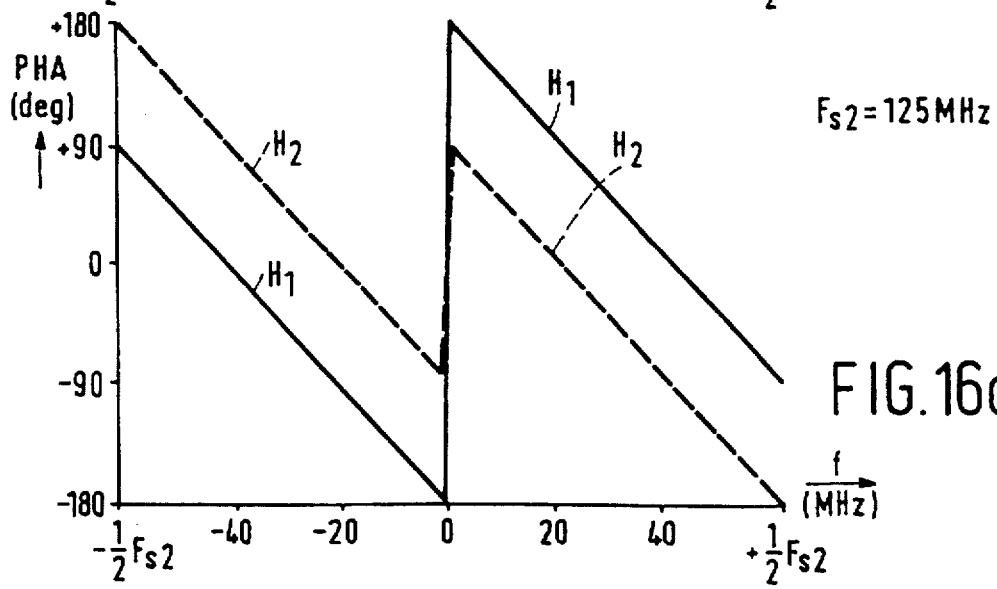
Figure 16E:
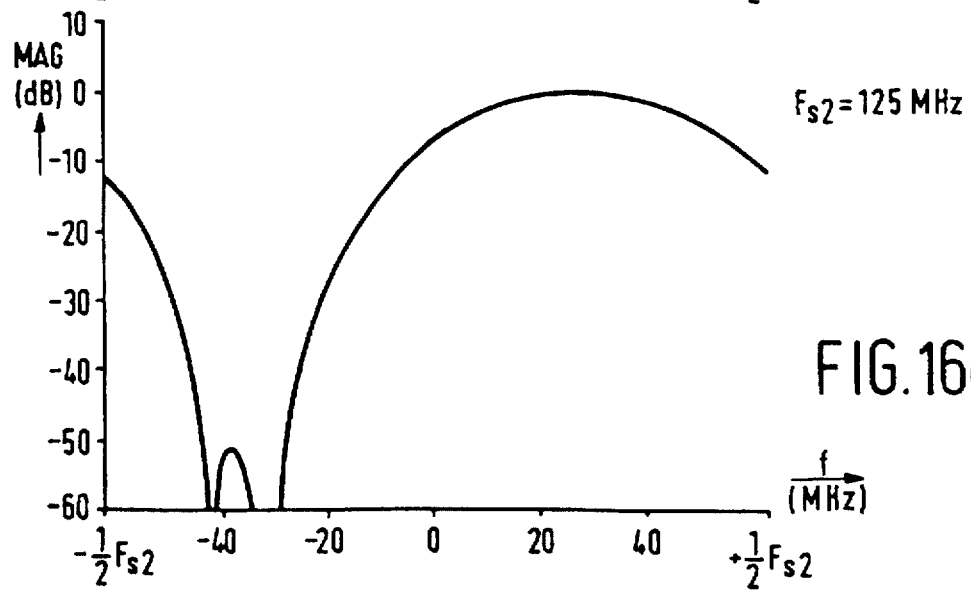

The magnitude and phase characteristics, mag{H3}, mag{H4} and pha{H3}, pha{H4}, respectively, are shown in FIGS. 16c and 16d. In the aliasing band the pha{H3} lags 90 degrees with respect to pha{H4}, while the mag{H3} and mag{H4} are substantially equal. It will now be understood that such characteristics substantially prevent the occurrence of a frequency component in the aliasing band at the pair of inputs 181, 191. FIG. 16e shows a magnitude-frequency plot related to the transfer from the pair of inputs 151, 152 to the pair of inputs 181, 191.

Figure 17:
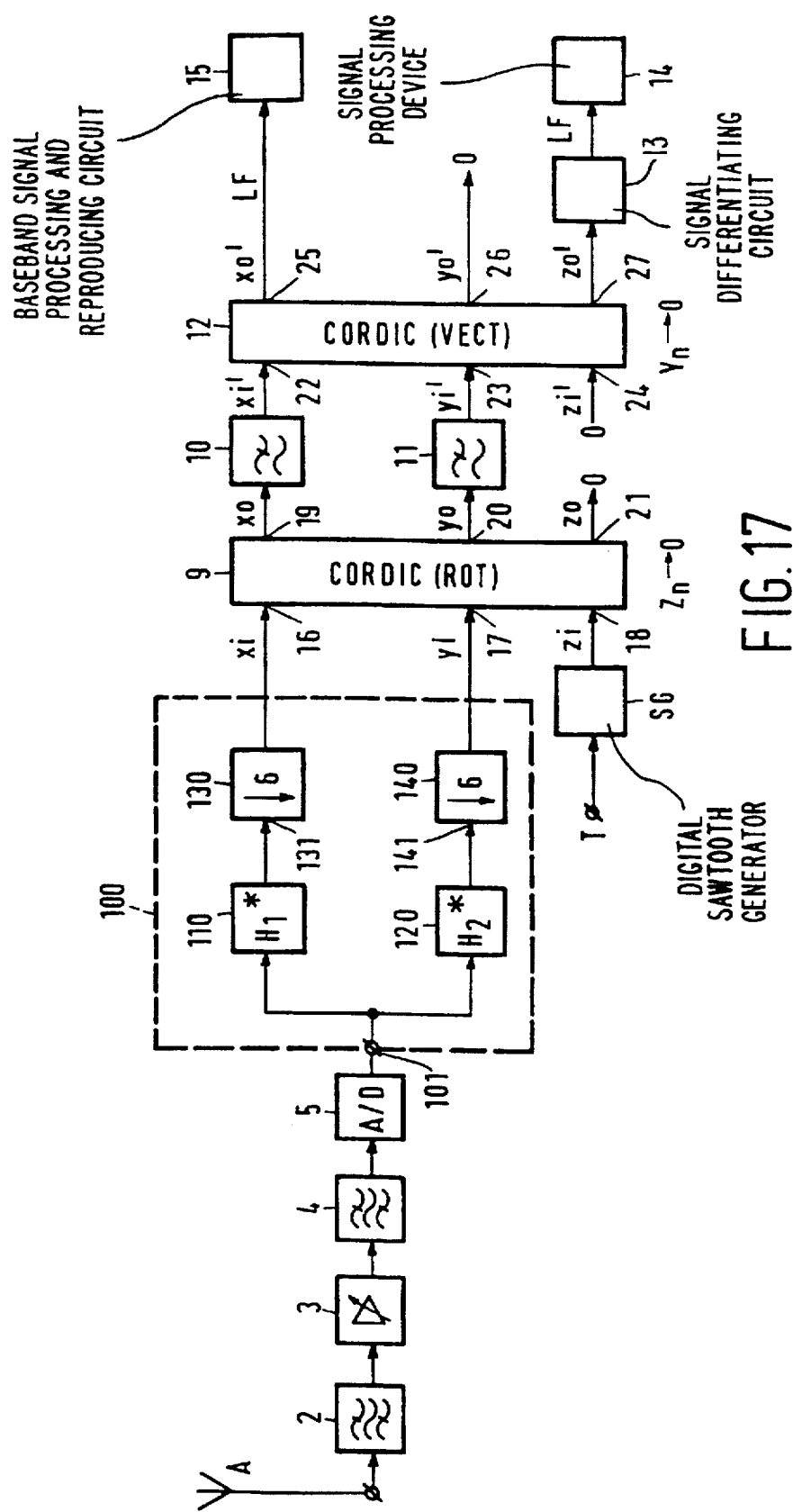
FIG. 17 shows a third receiver according to the invention.

It should be noted that the cascade of the splitter 100 and the quadrature decimating filter 150 can be substituted by a single splitter with R=6. This is shown in FIG. 17. A possible set of transform functions H5 and H6 that prevent the occurrence of frequency components in the aliasing bands can readily be determined, given the transform functions H1, H2, H3 and H4 in the receiver shown in FIG. 15. In the z-notation the following applies:

$$H_5(z) = H_1(z)H_3(z^3) - H_2(z)H_4(z^3)$$

$$H_6(z) = H_1(z)H_4(z^3) + H_2(z)H_3(z^3)$$

To arrive at the above expressions, decimators 130 and 140 in FIG. 15 are 'shifted' through the transform stages 160a, 160b, 170a and 170b, to be combined with decimators 180 and 190 into R=6. This causes the transform function H3(z) and H4(z) to change into H3($z^3$) and H4($z^3$).

However, in general it is advantageous to have a splitter with a relatively low decimation factor followed by a quadrature decimating filter, as in FIG. 15, compared to a single splitter with a relatively high decimation factor, as in FIG. 17. For example, in the latter case, two transversal filters of the length L=15 are needed to realise the transform functions H5(z) and H6(z) in accordance with the expression above. These two filters will require more circuit elements than the total number of circuit elements for the transversal filters in the splitter and the quadrature decimating filter in the receiver shown in FIG. 15. Moreover, in FIG. 17 the two transversal filters with L=15 operate at a relatively high clock frequency (375 MHz), whereas the quadrature decimating filter in FIG. 15 operates at one-third of this clock frequency. In the receiver shown in FIG. 15 only two transversal filters with L=6 operate at 375 MHz. Hence, the latter receiver will consume less power than the receiver shown in FIG. 17.

In summary, power efficient digital receivers of a relatively simple structure have been presented. A reception signal is digitized with a relatively high sampling frequency; simple analog filters prevent aliasing. The digitized reception signal is applied via a splitter to a quadrature digital signal processor. In this processor, a desired carrier is selected and demodulated. The splitter transforms the digitized reception signal in accordance with a first and a second transform function to obtain in-phase and quadrature components, respectively. The sampling frequency is reduced in the splitter. A specific relation between the phase and magnitude of the transform functions prevents aliasing for at least one frequency band. Such a relation can be achieved with relatively simple filters.

While a limited number of embodiments are shown and described to clarify the invention, a person skilled in the art may conceive many other alternative embodiments without departing from the spirit and the scope of the invention claimed.

In a receiver according to the invention the received RF signal may first be converted to an intermediate frequency (IF) signal before it is digitized. For example, in a television receiver it may be preferable to digitize the output signal of a television tuner which provides an IF signal of approximately 40 MHz. The digitized IF signal is then applied to a digital signal processing arrangement as shown in FIG. 8. A similar technique can be applied in a DAB receiver. A digitized DAB IF signal is applied to a splitter which comprises decimators and is subsequently converted to in-phase and quadrature baseband signals which are filtered and applied to a Fast Fourier Transformer for OFDM-demodulation.

In the receiver shown in FIG. 15, a further quadrature decimating filter could be inserted between quadrature decimating filter 150 and the first Cordic 9. In principle, the sampling frequency can be reduced as long as the width of the desired band does not exceed the sampling frequency. For example, the decimation factor of said further quadrature decimating filter could be R=3. This would reduce the sampling frequency at the input of first Cordic 9 to 20.83 MHz, which sampling frequency exceeds the width of the desired band: 20.5 MHz.

There are various ways in which the splitter and quadrature decimating filters may be implemented. The embodiment shown in FIG. 14 is only one possible implementation. In alternative embodiments, the decimators may be merged into filters. This is known as a polyphase structure and is, for example, described in 'Multirate Digital Signal Processing' by R. E. Crochiere and L. R. Rabiner, page 79, etc. Such a polyphase structure is generally power efficient. It should equally be noted that the filters need not be transversal filters. For example, recursive filters may equally be employed. The invention deals with a specific magnitude and phase relation of the filters in a splitter or a decimating quadrature filter. A person skilled in the art may conceive various filter structures which have said specific magnitude and phase relation.

Not in all cases a quadrature decimating filter needs to have cross-couplings between the in-phase and quadrature signal paths, such as transform stages 170a and 170b in FIG. 15. Whether or not it is advantageous to omit these cross-couplings depends on the location of the aliasing bands with respect to the desired band. As such, the transform stages in series with the in-phase and quadrature signal paths, transform stages 170a and 170b in FIG. 15 for example, can only provide a magnitude characteristic which is symmetric with respect to zero frequency. If an image of an aliasing band with respect to zero frequency is close to the desired band, said transform stages would become rather complicated if no cross couplings were used.

The transform functions in the splitter and/or in the quadrature decimating filters may be controlled in dependence on the tuning of the digital quadrature processor. In such a way, mutual phase and magnitude relations of relevant transform functions can be optimized to provide maximum aliasing suppression for a specific tuning.

In general, the Figures are best regarded as functional diagrams; indeed many of the digital signal processing modes may be implemented, for example, in software. Filters may be in the form of a general purpose digital signal processor with filter coefficients stored in a memory inside or outside this processor. Of course, at least one Cordic shown in the Figures may also be included in said processor. For software implementations, the invention, provides, inter alia the advantage of relatively few computation cycles.

Furthermore, it will be clear that digital signal processing stages shown in parallel in the Figures may be substituted by one stage operating in time-division multiplex operation. For example, the quadrature decimating filter may comprise one calculation unit coupled to a memory in which the coefficients for both transform functions are stored. This calculation unit calculates output samples corresponding to a sample of the first and the second split signal, alternately. In that case, the splitter may provide the two split signals in time-division multiplex and the first Cordic may receive in-phase and quadrature input signals in time-division multiplex.

Finally, it should be noted that the gist of the invention also applies to upsampling, that is, increasing the sampling frequency. In that case, elements are arranged in reverse order and their function is inverse with respect to subsampling. A digital signal processor provides a digital signal within a frequency band Q, which signal has in-phase and a quadrature components. The sampling frequency of both components is increased by a factor R, the interpolation factor. Furthermore, the in-phase and quadrature components are transformed in accordance with a first and a second transform function, respectively, and subsequently combined. For upsampling an anti-aliasing technique can be used that is similar to that for subsampling as presented in the foregoing.

Due to upsampling, the frequency interval is extended from [−½Fs2,+½Fs2] at the output of the digital quadrature processor to [−½Fs1,+½Fs1] at the output of interpolators that increase the sampling frequency from Fs2 to Fs1= R•Fs2. For example, the spectrum seen at the output of the digital signal processor could be as that shown in FIG. 9a. Then, for R=2 the corresponding spectrum seen at the output of the interpolators is as that shown in FIG. 9b. Similarly as in the case of subsampling only one of the two frequency bands in FIG. 9b is desired. Similar to subsampling, the occurrence of signal components in the undesired band can be countered with an appropriate 90 degrees phase relation between the transform functions in said band.

We claim:

1. A receiver comprising:
    an input for receiving a digitized reception signal having a first sampling frequency Fs1;
    a splitter for transforming the digitized reception signal in accordance with a first and a second transform function, respectively, to obtain a first split signal and a second split signal, respectively; and
    a digital quadrature processor for processing a signal within a band Q, said processor having an input for receiving said first and second split signals as in-phase and quadrature signal components, respectively,
characterized in that said splitter comprises sampling frequency reduction means such that said first and second split signals have a second sampling frequency Fs2 which is R times lower (R=decimation factor) than that of the first sampling frequency, and in that for at least one aliasing band X which is a frequency shift of band Q over k•Fs2, k being an integer, the phase characteristic of said first transform function is substantially 90 degrees phase lagging with respect to that of said second transform function, while the magnitude characteristics are substantially equal.

2. A receiver as claimed in claim 1, characterized in that the digital quadrature processor comprises a quadrature decimation stage arranged between said input and further stages of the digital quadrature processor.

3. A receiver as claimed in claim 2, characterized in that the quadrature decimation stage comprises:
    first means for transforming both said first and second split signals in accordance with a third transform function;
    second means for transforming both said first and second split signals in accordance with a fourth transform function which differs substantially 90 degrees in phase with respect to the third transform function over at least one aliasing band, while the magnitudes are equal;
    third means for combining said first and second split signals which have been transformed in accordance with said third and fourth transform function, respectively, and for applying the combined signals as in-phase components to said further quadrature stage;
    fourth means for combining said first and second split signals which have been transformed in accordance with said fourth and third transform function, respectively, and for applying the combined signals as quadrature components to said further quadrature stage.

4. A receiver as claimed in claim 2, characterized in that one of said transform functions has a symmetric impulse response and in that the other transform function has an anti-symmetric impulse response.

5. A receiver as claimed in claim 1, characterized in that said transform functions are implemented as filters in which the filter coefficients are determined by means for bit-shifting signal samples and, subsequently, for combining the bit-shifted signal samples.

6. A receiver as claimed in claim 1, characterized in that one of said transform functions has a symmetric impulse response and in that the other transform function has an anti-symmetric impulse response.

7. A digital signal processing arrangement comprising:
    a splitter for transforming a digital signal in accordance with a first and a second transform function, respectively, to obtain a first split signal and a second split signal, respectively; and
    a digital quadrature processor for selecting a digital signal component within a band B, said processor having an input for receiving said first and second split signals as in-phase and quadrature signal components, respectively,
characterized in that said splitter comprises sampling frequency reduction means such that said first and second split signals have a second sampling frequency Fs2 which is R times lower (R=decimation factor) than that of the first sampling frequency, and in that for at least one aliasing band X which is a frequency shift of band B over k•Fs2, k being an integer, the phase characteristic of said first transform function is substantially 90 degrees phase lagging with respect to that of said second transform function, while the magnitude characteristics are substantially equal.

8. A quadrature decimation stage comprising:
    first means for transforming both an in-phase and a quadrature component of a quadrature input signal in accordance with a first transform function;
    second means for transforming both said in-phase and said quadrature component in accordance with a second transform function which differs substantially 90 degrees in phase with respect to the third transform function over at least one aliasing band, while the magnitudes are equal;

third means for combining said in-phase and said quadrature components which have been transformed in accordance with said first and second transform function, respectively, and for supplying the combined components as in-phase component of an output signal;

fourth means for combining said in-phase and said quadrature component which have been transformed in accordance with said second and first transform function, respectively, and for supplying the combined components as quadrature component of an output signal.

9. A method of processing a digital signal with a sampling frequency Fs1, said method comprising the steps of:

transforming said digital signal in accordance with a first transform function to obtain a first split signal;

transforming said digital signal in accordance with a second transform function to obtain a second split signal; and using said first and second split signals as in-phase and quadrature components, respectively, to process the combination of said signals within a band Q, while transforming said digital signal into said first and second split signals, respectively:

reducing the sampling frequency in such a way that said first and second split signals have a sampling frequency Fs2 which is R times lower than Fs1, R being an integer;

making the first split signal to phase lag substantially 90 degrees with respect to the second split signal in an aliasing band X; and keeping the magnitudes of said split signals substantially the same in said aliasing band X;

said aliasing band X being a frequency shift of band Q over k•Fs2, k being an integer.

10. A method of supplying a digital quadrature signal with a sampling frequency Fs1 to a digital quadrature signal processor which processes with frequency band Q, said method comprising the steps of:

transforming an in-phase component of said signal in accordance with a first transform function and a quadrature component of said signal in accordance with a second transform function to obtain a first transform component and a second transform component, respectively, the phase characteristic of said first transform function being 90 degrees phase leading with respect to said second transform function;

subtracting the second transform component from the first transform component and applying the result thereof as an in-phase signal component to said input of the digital quadrature signal processor;

transforming a quadrature component of said signal in accordance with a first transform function and an in-phase component of said signal in accordance with a second transform function to obtain a third transform component and a fourth transform component, respectively;

adding the third transform component to the fourth transform component and applying the result thereof as a quadrature signal component to said input of the digital quadrature signal processor;

reducing the sampling frequency in such a way that a quadrature signal applied to said input of said digital quadrature signal processor has a sampling frequency Fs2 which is R times lower than Fs1, R being an integer.

* * * * *